United States Patent
Dominguez et al.

(10) Patent No.: US 7,851,360 B2
(45) Date of Patent: Dec. 14, 2010

(54) ORGANOMETALLIC PRECURSORS FOR SEED/BARRIER PROCESSES AND METHODS THEREOF

(75) Inventors: Juan Dominguez, Hillsboro, OR (US); Adrien Lavoie, Beaverton, OR (US); John Plombon, Portland, OR (US); Joseph Han, San Jose, CA (US); Harsono Simka, Saratoga, CA (US); David Thompson, Tonawanda, NY (US); John Peck, Tonawanda, NY (US)

(73) Assignee: Intel Corporation, Santa Clara, CA (US)

(*) Notice: Subject to any disclaimer, the term of this patent is extended or adjusted under 35 U.S.C. 154(b) by 772 days.

(21) Appl. No.: 11/675,066

(22) Filed: Feb. 14, 2007

(65) Prior Publication Data

US 2008/0194105 A1   Aug. 14, 2008

(51) Int. Cl.
  *H01L 21/44* (2006.01)
(52) U.S. Cl. .................. 438/681; 438/648; 438/650; 438/653; 438/654; 257/E21.171; 257/E21.476
(58) Field of Classification Search .......... 438/618, 438/643, 644, 648, 650, 653, 654, 656, 681; 257/E21.171, E21.476
  See application file for complete search history.

(56) References Cited

U.S. PATENT DOCUMENTS

| | | | |
|---|---|---|---|
| 5,391,517 A | 2/1995 | Gelatos et al. | |
| 6,054,398 A | 4/2000 | Pramanick | |
| 6,136,725 A * | 10/2000 | Loan et al. ............. | 438/758 |
| 6,203,613 B1 | 3/2001 | Gates et al. | |
| 6,337,148 B1 | 1/2002 | Xu | |
| 6,498,091 B1 | 12/2002 | Chen et al. | |
| 7,074,719 B2 | 7/2006 | Kim et al. | |
| 7,129,161 B2 | 10/2006 | Donohue | |
| 7,300,869 B2 * | 11/2007 | Sun et al. ............... | 438/648 |
| 7,335,587 B2 * | 2/2008 | Johnston et al. ........ | 438/637 |
| 2002/0132469 A1 | 9/2002 | Lee et al. | |
| 2003/0180451 A1 | 9/2003 | Kodas et al. | |
| 2005/0009325 A1 * | 1/2005 | Chung et al. ........... | 438/637 |
| 2005/0208754 A1 | 9/2005 | Kostamo et al. | |
| 2006/0141155 A1 | 6/2006 | Gordon et al. | |
| 2006/0223300 A1 * | 10/2006 | Simka et al. ........... | 438/618 |
| 2006/0240187 A1 | 10/2006 | Weidman | |
| 2007/0155158 A1 | 7/2007 | Gstrein et al. | |
| 2007/0264816 A1 | 11/2007 | Lavoie et al. | |
| 2008/0044687 A1 | 2/2008 | Bradley et al. | |
| 2008/0064205 A1 | 3/2008 | Dominguez et al. | |
| 2008/0146042 A1 * | 6/2008 | Kostamo et al. ....... | 438/778 |
| 2008/0223287 A1 | 9/2008 | Lavoie et al. | |

(Continued)

OTHER PUBLICATIONS

IC Knowledge, "Atomic layer deposition (ALD)", ICKnowledge.com, (2003).

(Continued)

*Primary Examiner*—Matthew C Landau
*Assistant Examiner*—Colleen E Snow
(74) *Attorney, Agent, or Firm*—Blakely, Sokoloff, Taylor & Zafman LLP

(57) ABSTRACT

Organometallic precursors and methods for deposition on a substrate in seed/barrier applications are herein disclosed. In some embodiments, the organometallic precursor is a ruthenium-containing, tantalum-containing precursor or combination thereof and may be deposited by atomic layer deposition, chemical vapor deposition and/or physical vapor deposition.

30 Claims, 8 Drawing Sheets

U.S. PATENT DOCUMENTS

2008/0318418 A1    12/2008    Norman
2009/0053893 A1    2/2009    Khandelwal et al.
2009/0246931 A1*  10/2009  Huotari et al. .............. 438/398

OTHER PUBLICATIONS

Lapedus, "ALD takes one step forward, one step back", EE Times Online, http://www.eetimes.com/showArticle.jhtml?articleID=191901291, (Aug. 10, 2006), 3 pages.

The Organometallic Hypertextbook, "Cyclopentadienyl Ligands", http://www.ilpi.com/organomet/cp.html, (Nov. 20, 2006), 7 pages.

Wikipedia, "Ruthenium", http://en.wikipedia.org/wiki/Ruthenium, (Nov. 20, 2006), 4 pages.

Wikipedia, "Tantalum nitride barrier layer in copper-based ICs", Tantalum(III) nitride, http://en.wikipedia.org/wiki/Tantalum(III)_nitride, (Sep. 2, 2006), 4 pages.

Zschech, et al., "Barrier/seed step coverage analysis in via structures for in-laid copper process control", MRI Montgomery Research, Future Fab International, vol. 14; http://www.future-fab.com/documents.asp?grID=216&d_ID=1673, (Feb. 11, 2003), 13 pages.

Intel Corporation, Office Action mailed 03/34/2009 for U.S. Appl. No. 11/694,677.

Inman, et al., "Evaluation of terakis(diethylamino)hafnium Precursor in the Formation of Hafnium Oxide Films Using Atomic Layer Deposition", Mat. Res. Soc. Symp. Proc. vol. 765, 2003 Materials Research Society.

Intel Corporation, Final Office Action mailed Sep. 16, 2009; U.S. Appl. No. 11/694,677.

Intel Corporation, Non final Office Action mailed Nov. 24, 2009; U.S. Appl. No. 11/694,677.

Intel Corporation, Non final office action dated Apr. 9, 2010 for U.S. 11/694,677.

Li, et al., "Atomic layer deposition of ultra thin copper metal thin films from a liquid Copper(I) amidinate precursor,"Journal of Electrochemical Society, 153(11), C787-C794 (2006).

* cited by examiner

ORGANOMETALLIC PRECURSORS FOR SEED/BARRIER PROCESSES AND METHODS THEREOF

FIELD OF INVENTION

Seed/barrier processes for integrated circuits.

BACKGROUND OF INVENTION

In the manufacture of integrated circuits, copper interconnects are generally formed on a semiconductor substrate using a copper dual damascene process. Such a process begins with a trench being etched into a dielectric layer and filled with a barrier layer, an adhesion layer, and a seed layer. A physical vapor deposition (PVD) process, such as a sputtering process, or an atomic layer deposition (ALD) process, may be used to deposit a tantalum nitride (TaN) barrier layer and a tantalum (Ta) or ruthenium (Ru) adhesion layer (i.e., a TaN/Ta or TaN/Ru stack) into the trench. The TaN barrier layer prevents copper from diffusing into the underlying dielectric layer. The Ta or Ru adhesion layer is required because the subsequently deposited metals do not readily adhere to the TaN barrier layer. This may be followed by a PVD sputter process to deposit a copper seed layer into the trench. An electroplating process is then used to fill the trench with copper metal to form the interconnect.

As device dimensions scale down, the aspect ratio of the trench becomes more aggressive as the trench becomes narrower. This gives rise to issues such as trench overhang during the copper seed PVD deposition, leading to pinched-off trench openings and inadequate gapfill. Additionally, as trenches decrease in size, the ratio of barrier metal to copper metal in the overall interconnect structure increases, thereby increasing the electrical line resistivity and RC delay of the interconnect.

In addition to the above, seed integration issues are observed at the 32 nanometers (nm) and below nodes using conventional seed/barrier processes. With respect to manufacturing, use of separate barrier and seed layers makes tooling expensive thereby increasing the overall price of production.

The TaN barrier layer may be deposited by ALD using amine-containing tantalum precursors and ammonia gas ($NH_3$). Unreacted ammonia can cause photoresist "poisoning" in subsequent fabrication operations.

Recently, low thermal stability ruthenium precursors have been used to deposit ruthenium films in seed/barrier applications in an attempt to address the problems discussed above. Typically, the ruthenium precursor is deposited in the presence of molecular oxygen using ALD. In one example, the precursor $Ru_3CO_{12}$ was used to deposit a ruthenium-containing layer, resulting in layers with high carbon and oxygen contamination.

DETAILED DESCRIPTION

Figure 1A:
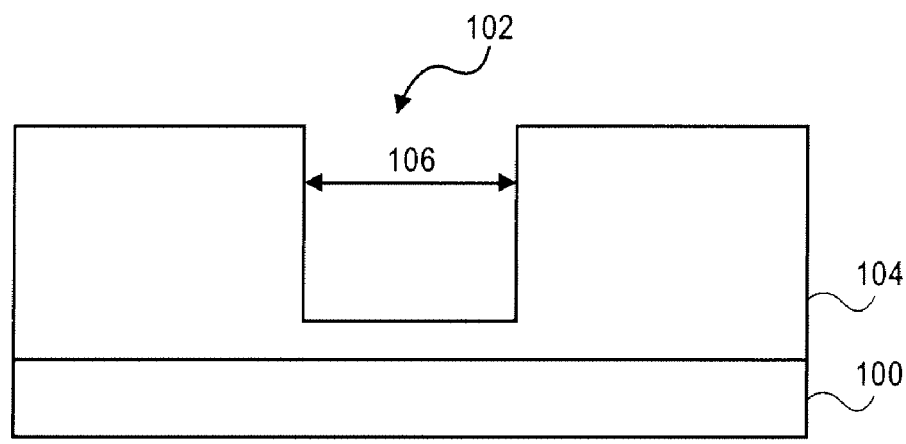
FIGS. 1A-1E illustrate cross-sections of a substrate during a conventional damascene process for forming interconnects.

FIGS. 1A to 1E illustrate a damascene process for fabricating copper interconnects on a semiconductor wafer. FIG. 1A illustrates a substrate 100, such as a semiconductor wafer, which includes a trench 102 that has been etched into a dielectric layer 104. The trench 102 includes a gap 106 through which metal may enter during metallization processes.

Figure 1B:
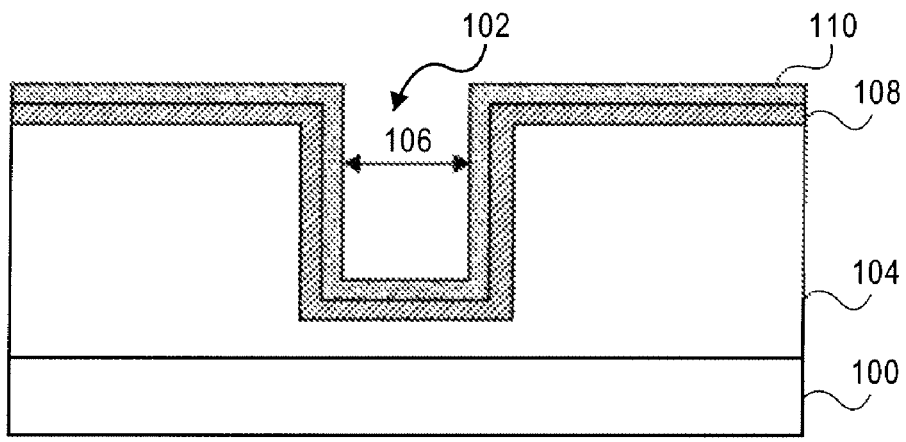

FIG. 1B illustrates the trench 102 after a conventional barrier layer 108 and a conventional adhesion layer 110 have been deposited thereon. The barrier layer 108 prevents copper metal from diffusing into the dielectric layer 104. The adhesion layer 110 enables copper metal to become deposited onto the barrier layer 108. The barrier layer 108 is generally formed using a material such as tantalum nitride (TaN) and is deposited using a PVD process. The barrier layer 108 may be around 10 Angstroms (Å) to 10 nanometers (nm) thick, although it is generally around 5 nm thick. The adhesion layer 110 is generally formed using a metal such as tantalum (Ta) or ruthenium (Ru) and is also deposited using a PVD process. The adhesion layer 110 is generally around 5 nm to 10 nm thick.

After the adhesion layer 110 is formed, a typical damascene process of FIG. 1 uses two independent deposition processes to fill the trench 102 with copper metal. The first deposition process is a PVD process that forms a non-conformal copper seed layer. The second deposition process is a plating process, such as an electroplating (EP) process or an electroless plating (EL) process, that deposits a copper layer to fill the trench 102 to form an interconnect.

Figure 1C:
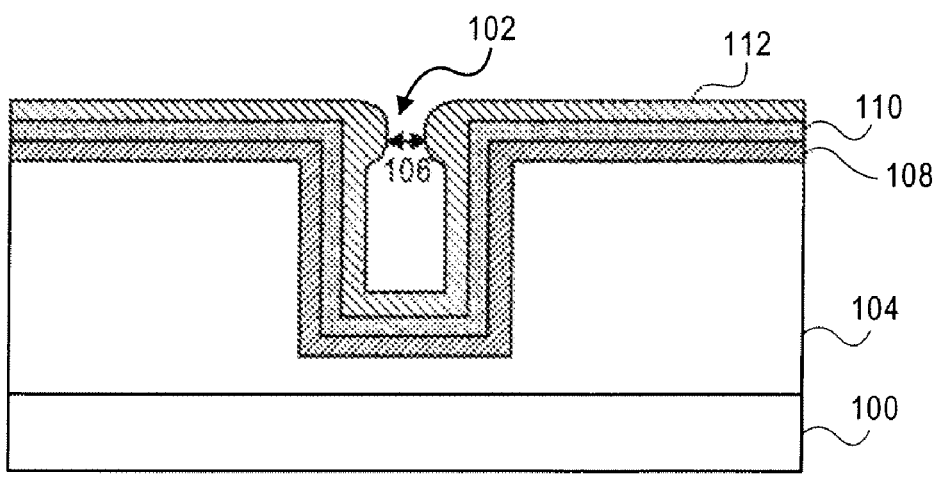
Figure 1D:
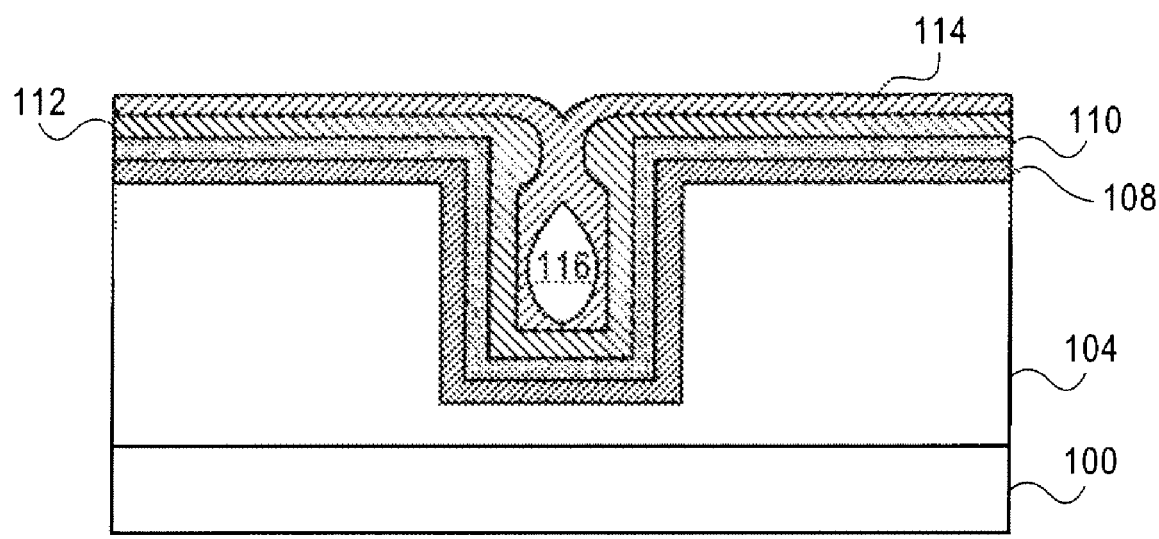

FIG. 1C illustrates the trench 102 after a copper seed layer 112 has been deposited onto the adhesion layer 110 using a PVD process. The copper seed layer 112 enables or catalyzes a subsequent plating process to fill trench 102 with copper metal. FIG. 1D illustrates the trench 102 after an EP or EL copper deposition process has been carried out. Copper metal 114 enters trench 102 through the gap 106 where, due to the narrow width of gap 106, issues such as trench overhang and pinching off of the opening of trench 102 may occur causing defects in the plating process. For instance, as shown in FIG. 1D, trench overhang may occur that pinches off the opening of the trench 102, creating a void 116 that will appear in the final interconnect structure.

Figure 1E:
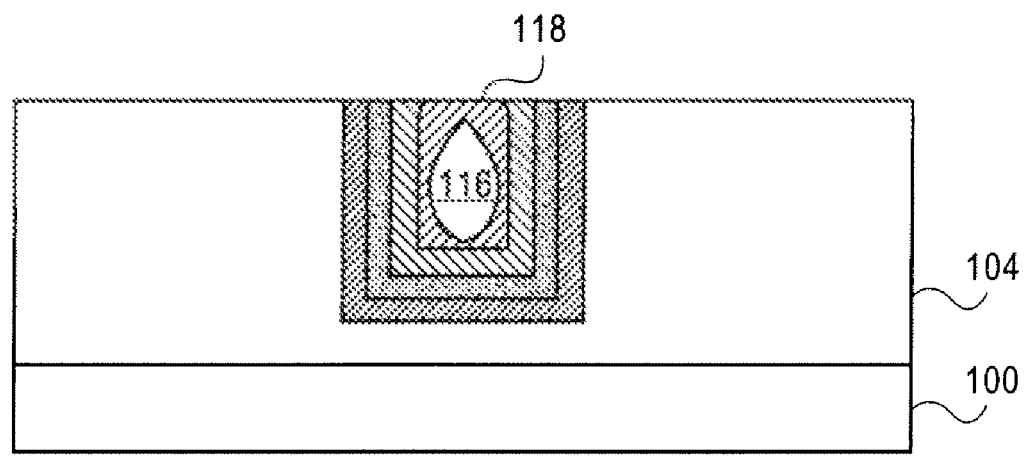

FIG. 1E illustrates trench 102 after a chemical mechanical polishing (CMP) process is used to planarize the deposited copper metal 114. CMP results in the formation of a metal interconnect 118. As shown, the metal interconnect 118 includes the void 116 that was formed when the available gap 106 was too narrow due to pinch off the trench opening.

According to embodiments of the invention, novel ruthenium-containing and tantalum-containing precursors can be used to deposit an adhesion layer and a barrier layer, respectively, on a substrate which includes a trench therein. In some embodiments, the ruthenium-containing and tantalum-containing precursors are fluorine-free. Fluorine can be detrimental because it can form stable bonds with metals such as tantalum and create interfacial contamination. This contaminated interface, e.g., copper/tantalum, can negatively impact adhesion and thus electromigration of copper lines. The ruthenium-containing precursors can have a characteristic which, in some embodiments, allow a precursor to be deposited at a faster rate relative to known ruthenium-containing precursors. The tantalum-containing precursors can have a characteristic which, in some embodiments, allow an amine-free precursor to be deposited resulting in a nitrogen free film. In some embodiments, single layer deposition of a barrier layer based on the tantalum-containing precursors and a subsequent single layer deposition of an adhesion layer based on the ruthenium-containing precursors, respectively, can eliminate the need for a copper seed layer thereby substantially or completely eliminating the complications outlined with respect to FIGS. 1A-1E. In other embodiments, single layer deposition of an integrated barrier/adhesion layer can be accomplished by a homogenous deposition of a ruthenium-containing precursor and a tantalum-containing precursor.

Ruthenium is a directly plateable material and is known for its suitability as an electrode in direct random access memory (DRAM) applications and as a metal gate for complementary metal-oxide-semiconductor (CMOS) applications. Ruthenium can be used as an adhesion layer in barrier/seed applications or barrier/electroplating applications. Ruthenium-containing precursors can be used to form an adhesion layer or a barrier-adhesion layer on a substrate according to embodiments of compositions and methods of the invention. The ruthenium-containing precursors can be deposited on a substrate by a variety of deposition processes, such as, but not limited to, thermal atomic layer deposition (ALD), plasma-enhanced atomic layer deposition (PEALD), chemical vapor deposition (CVD) and plasma-enhanced chemical vapor deposition (PECVD). Such ruthenium-containing compounds can include, but are not limited to, compounds having the general formula of RuRR'R", (Ring)RuL$_2$R, (Ring)RuLL'R or (Ring)Ru[($\eta^3$-R)(Ring)RuL$_2$], where R is a negatively charged two-electron donor such as an amide, a nitride or an alkyldiene; Ring is an unfunctionalized or functionalized member such as cyclic dienes, pyrroles, dienes, boratabenzene or dienes containing heteroatoms; L is a neutral two-electron donor ligand such as carbon monoxide, nitric oxide, dienes, amine, nitrile, isocyanides or phosphines; and $\eta^3$-R is a negatively charged chelating four-electron donor such as allyls, azaallyls, amidinates or cyclobutadienes.

Tantalum can be used as an adhesion layer in barrier/seed applications or barrier/electroplating applications. Tantalum-containing precursors can be used to form an adhesion layer, a barrier layer or a barrier-adhesion layer on a substrate according to embodiments of compositions and methods of the invention. The tantalum-containing precursors can be deposited on a substrate by a variety of deposition processes, such as, but not limited to, ALD, PEALD, CVD and PECVD. Such tantalum-containing compounds can include, but are not limited to, compounds such as allylTa(CH$_3$)$_3$ (where allyl is $\eta^3$-C$_3$H$_5$), (C$_5$H$_5$)$_2$TaR variations (where R is an amide or alkyl substituent), Ta(borylidiene)-containing precursors, (PR$_3$=N)Ta variations (where P is a phosphorous, R is a hydrogen, alkyl, or phenyl substituent, and PR$_3$=N is a phosphinamide ligand) and selenium (Se) analogs thereof where R is a ring structure such as, cyclic dienes, mesityl, phenyl, tolyl, pyrroles or pyridyl.

A metal precursor containing carbon and/or nitrogen can be used to form a metal nitride and/or carbide barrier layer(s) on a substrate according to embodiments of compositions and methods of the invention. The resulting layers (or films) can include, but are not limited to, titanium nitride (TiN), tungsten nitride (WN), tantalum nitride (TaN), in addition to tantalum carbide (TaC) and tantalum carbonitride (TaCN). In one embodiment, an organometallic nitride precursor is of the general formula R$_3$TaNR' where R is an alkyl, hydrogen or an amide, and R' is any anionically charged hydrocarbon group, such as a 1- to 5-membered straight or branched alkyl group. In some embodiments, R' is a tert-butyl or tert-amyl group.

As briefly mentioned previously, single layer deposition of the precursors according to embodiments of the invention can be deposited by processes such as, ALD, PEALD, CVD, PECVD or related techniques. Physical vapor deposition uses mechanical or thermodynamic means to produce a thin film of solid. Physical deposition processes can include sputtering, evaporative deposition, electron beam evaporation and pulsed laser deposition. Atomic layer deposition is an activated deposition process (e.g., using thermal, plasma, or other activation methods) where reactants are introduced separately. Chemical vapor deposition is a chemical deposition process where the semiconductor substrate is exposed to one or more volatile precursors that react and/or decompose on the substrate surface to produce the desired deposit. Chemical vapor deposition processes can include atmospheric pressure CVD, low pressure CVD, photochemical CVD, laser CVD, metal-organic CVD, chemical beam epitaxy and chemical vapor infiltration. Atomic layer deposition is a variant of CVD where reactants are introduced separately. Both ALD and CVD type processes generally result in highly conformal film growth due to surface reactivity rather than species transport.

Figure 2:
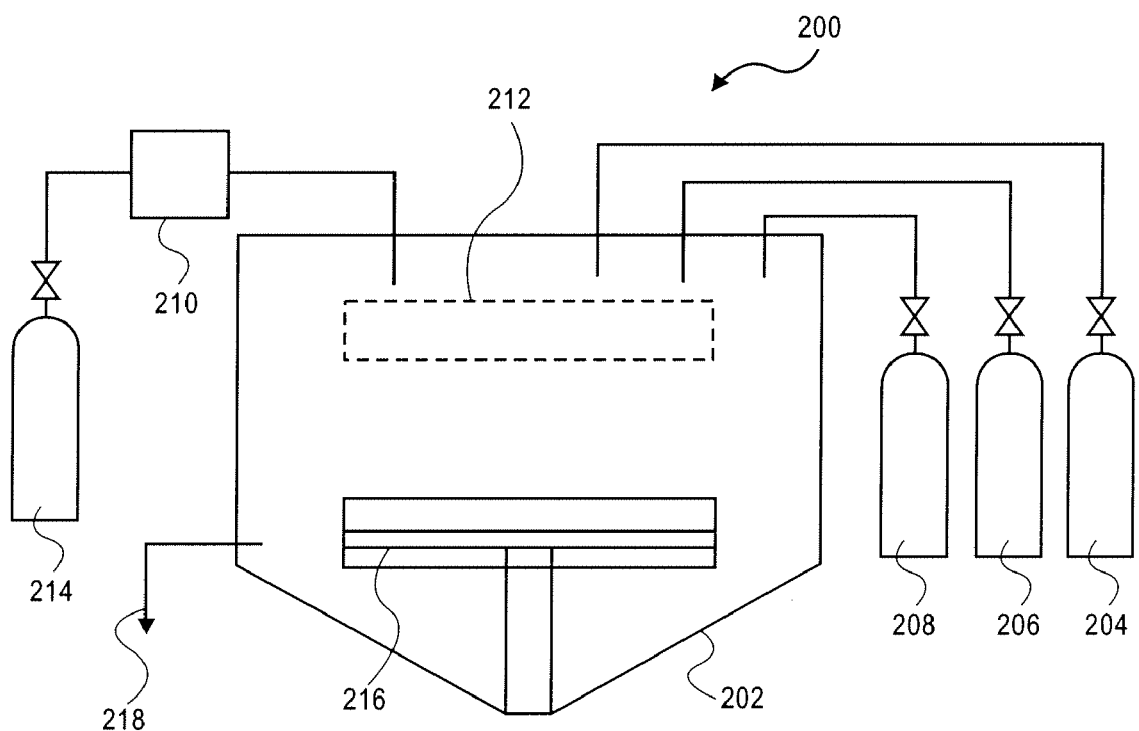
FIG. 2 illustrates an embodiment of a deposition system.

FIG. 2 shows a schematic of a representative deposition system. The system can be used for a CVD or ALD process. System 200, or reactor 200, includes chamber 202 having an interior volume suitable to accommodate a substrate, such as a semiconductor wafer. Connected to an interior volume of chamber 202 are a number of process gas sources, including gas source 204 that delivers, for example, an organometallic precursor; gas source 206 that delivers, for example, a co-reactant; and gas source 208 of a purge or other gas source. Also connected to chamber 202 is plasma activator 210 and/or plasma activator 212. Remote plasma activator 210 is separate from and communicates with chamber 202 while plasma activator 212 may be operated directly in chamber 202 (e.g., a capacitively coupled plasma electrode). In one example, a plasma activator such as remote plasma generator 210 and/or plasma generator 212 includes a plasma or ionization source for activating gas source 214, such as a hydrogen or other gas source(s) for introduction of the activated species into chamber 202 (plasma source to include ions, electrons, protons and radicals of the activated gas). The plasma source may be described in terms of energy density related to factors such as an energy applied to the gas source at the plasma activator (e.g., to establish a concentration of activated species in the plasma source) and the distance of plasma activator from a substrate surface in chamber 202. Energy density is one variable associated with a plasma source. Typical plasma densities can be in a range from 0.1 W/cm$^2$ to 1.0 W/cm$^2$. Other variables include the duration or exposure time of the substrate (or reactants) to the plasma source and when a plasma source is introduced. In one embodiment, the plasma source may be introduced during more than one of the pulses of an ALD process (e.g., during the purge pulse, co-reactant pulse or both).

System 200 also includes an example of a temperature source (shown as temperature source 216) that may be used to heat an interior of chamber 202 to a desired temperature for a reaction between the substrate and the precursor or precursor and co-reactant. FIG. 2 shows temperature source 216 disposed within chamber 202 (in this case, within a stage within the chamber). It is to be appreciated that a suitable reactor may include hotwall or coldwall chambers. FIG. 2 also shows evacuation source 218 connected to an interior chamber 202 to evacuate excess or non-reactive constituents or process gases from the chamber. Evacuation source 218 may be connected to a vacuum pump or other source (not shown).

Figure 3:
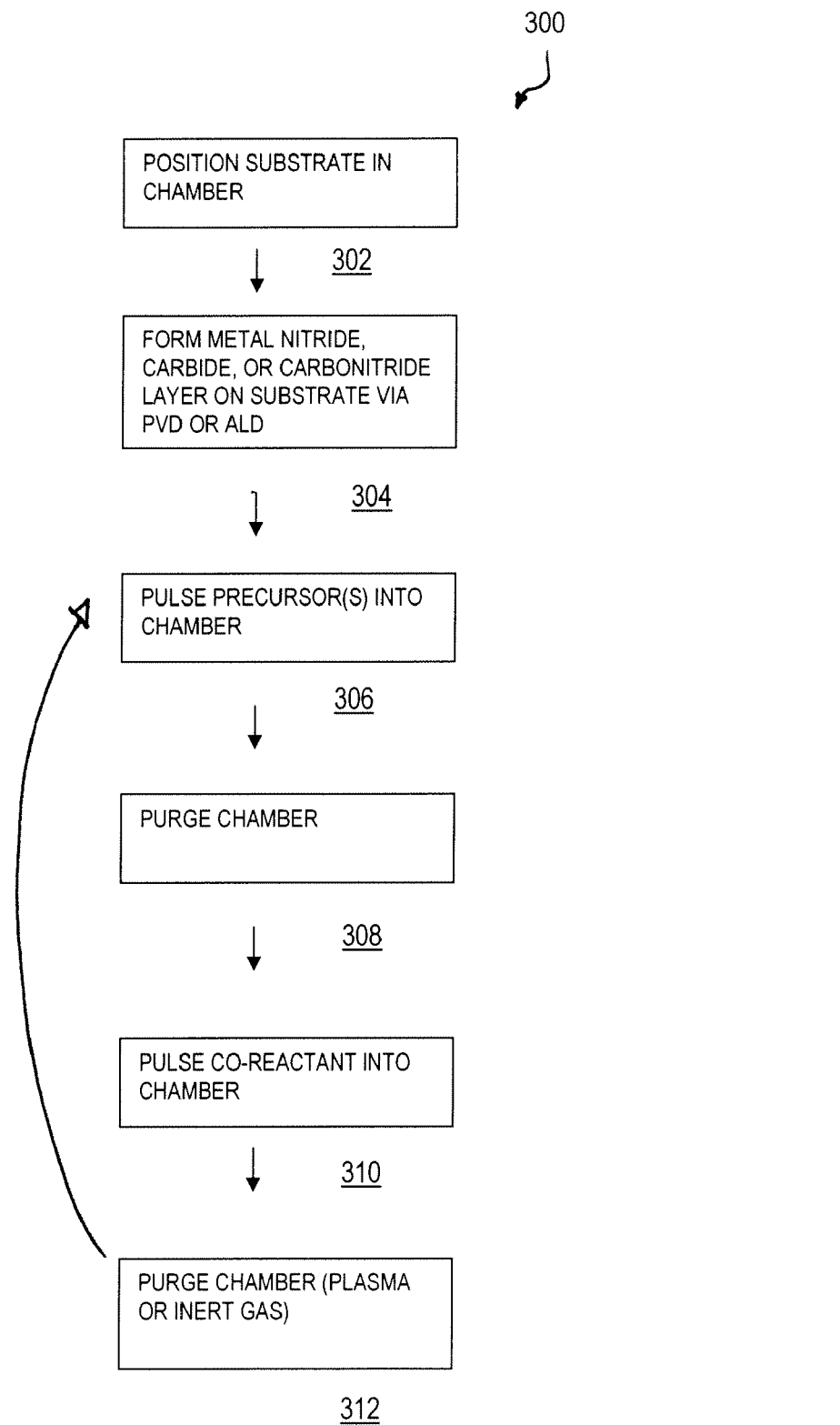
FIG. 3 is a flow chart representing an embodiment of a method of forming an adhesion layer using ALD.

FIG. 3 illustrates a schematic representation of a method of depositing an ALD layer on a substrate and a copper interconnect in accordance with an embodiment of the invention. A substrate, such as the substrate illustrated in FIG. 1A, can be positioned in the chamber of an ALD reactor (302). The substrate may be a silicon wafer having at least one dielectric layer deposited on its surface. The dielectric layer may include one or more trenches and/or vias within which the layer will be deposited and the copper interconnect will be formed. The dielectric layer may be formed from conventional materials used in dielectric layers, including, but not limited, to oxides such as silicon dioxide ($SiO_2$) and carbon doped oxide (CDO), silicon nitride, and organic polymers such as perfluorocyclobutane (PFCB). The substrate may be heated within the reactor to a temperature between around 50° C. and around 250° C. and the reactor may be heated to a temperature that ranges from 50° C. to 250° C. The pressure within the reactor may range from 0.1 Torr to 10 Torr.

In some embodiments, a metal precursor containing carbon and/or nitrogen can be deposited on the substrate to form a metal nitride and/or carbide barrier layer (304). The resulting layers (or films) can include, but are not limited to, titanium nitride, tungsten nitride, tantalum nitride, in addition to tantalum carbide and tantalum carbonitride. In one embodiment, the metal precursor is of the general formula $R_3TaNR'$ where R is an amide, an alkyl (such as neopentyl) or a hydride, and R' is any anionically charged hydrocarbon group, such as a 1- to 5-membered straight or branched alkyl group. In some embodiments, R' is a tert-butyl or tert-amyl group. The barrier layer can substantially or completely prevent diffusion of the subsequently-deposited interconnect material into the dielectric layer of the substrate. The barrier layer can be between about 1 nm and 20 nm.

A precursor material, such as a ruthenium-containing precursor, a tantalum-containing precursor, or a combination thereof (described previously), can be pulsed into the chamber (306) to form an adhesion layer on the barrier layer. In some embodiments, a homogenous pre-mixed combination of a ruthenium-containing precursor and a tantalum-containing precursor can be the precursor material and pulsed into the reactor. In other embodiments, a ruthenium-containing precursor and a tantalum-containing precursor can be simultaneously pulsed into the reactor. In still other embodiments, a ruthenium-containing precursor and a tantalum-containing precursor (or vice-versa) can be sequentially pulsed into the reactor, in which case either precursor can also act a co-reactant for the adsorbed layer.

The pulsing of the precursor can be between about 1 second to 20 seconds with a flow rate of up to 10 standard liters per minute (SLM). The specific number of precursor pulses may range from 1 pulse to 200 pulses or more depending on the desired thickness of the final layer. The precursor temperature may be between around 80° C. and 250° C. The vaporizer temperature may be around 60° C. to around 250° C. The precursor is carried by a carrier gas such as, but not limited to, helium (He), xenon (Xe), argon (Ar), nitrogen ($N_2$), any combination thereof, or any other suitable non-reactive gas with a temperature range between about 60° C. to about 250° C. The flow rate of the carrier gas may range from around 100 standard cubic centimeter (SCCM) to around 200 SCCM. In some embodiments of the invention, the previously-listed precursors may be modified by mixing of the ratio of ligands or substituting analogues of ligands. In other embodiments, more than one of the precursors, each having different ligands, may be used simultaneously in the ALD process.

The precursor delivery line into the reactor may be heated to a temperature that ranges from around 60° C. to around 250° C., or alternately, to a temperature that is at least 25° C. hotter than the vaporizer temperature to avoid condensation of the precursor. Generally, the delivery line temperature may be around 120° C. to 180° C.

Finally, an RF energy source may be applied at a power that ranges from 5 W to 1000 W and at a frequency of 13.56 MHz, 27 MHz, or 60 MHz. It should be noted that the scope of the invention includes any possible set of process parameters that may be used to carry out the embodiments of the invention described herein.

The chamber of the reactor is then purged in preparation for introducing a co-reactant (308). Examples of purge gases include, but are not limited to, $N_2$, He and Ar or other non-reactive gases. Purging can be between about 0.5 seconds and 40 seconds. A co-reactant can then be introduced into the chamber by pulsing (310). Co-reactants can include, but are not limited to, hydrogen gas ($H_2$), hydrogen plasma, sulfur ($S_8$), xenon (Xe), trimethylsilylazide, ammonia gas ($NH_3$), diborane ($B_2H_6$), silane ($SiH_4$), methane ($CH_4$), or plasma combinations thereof. Conventional process parameters may be used for the co-reactant pulse. For instance, in embodiments of the invention, the process parameters for the co-reactant pulse include, but are not limited to, a co-reactant pulse duration of between around 0.5 second and 20 seconds, a co-reactant flow rate of up to 10 SLM, a reactor pressure between around 0.05 Torr and 1000 Torr, a co-reactant temperature between around 80° C. and 200° C., a substrate temperature between around 100° C. and around 400° C., and an RF energy source that may be applied at a power that ranges from 5 W to 200 W and at a frequency of 13.56 MHz, 27 MHz, or 60 MHz. It should be noted that the scope of embodiments of the invention includes any possible set of process parameters that may be used to carry out the embodiments of the invention described herein.

The chamber of the reactor is then purged again in preparation for introducing another precursor pulse (312). In some embodiments, the purging is performed with plasma. Plasma purging can be between about 0.5 seconds and 10 seconds. The sequence of precursor pulse/purge/co-reactant pulse/purge is repeated until the target film thickness is achieved on the ruthenium-containing, tantalum-containing, or combination thereof layer on the metal nitride, carbide or carbonitride layer. In some embodiments, the layer is deposited directly onto the dielectric layer. The final adhesion layer may be between about 1 nm and 5 nm.

The film can be cleaned by immersion in a wet chemical solution, plasma or a plating bath to remove surface oxides and contaminants. A trench (such as the trench in FIGS. 1A-1E) can then be filled with copper by electroplating or electroless plating. In some embodiments, Ru ALD or CVD can be used to fill the trench to be able to use alternative materials for local interconnects.

Figure 3A:
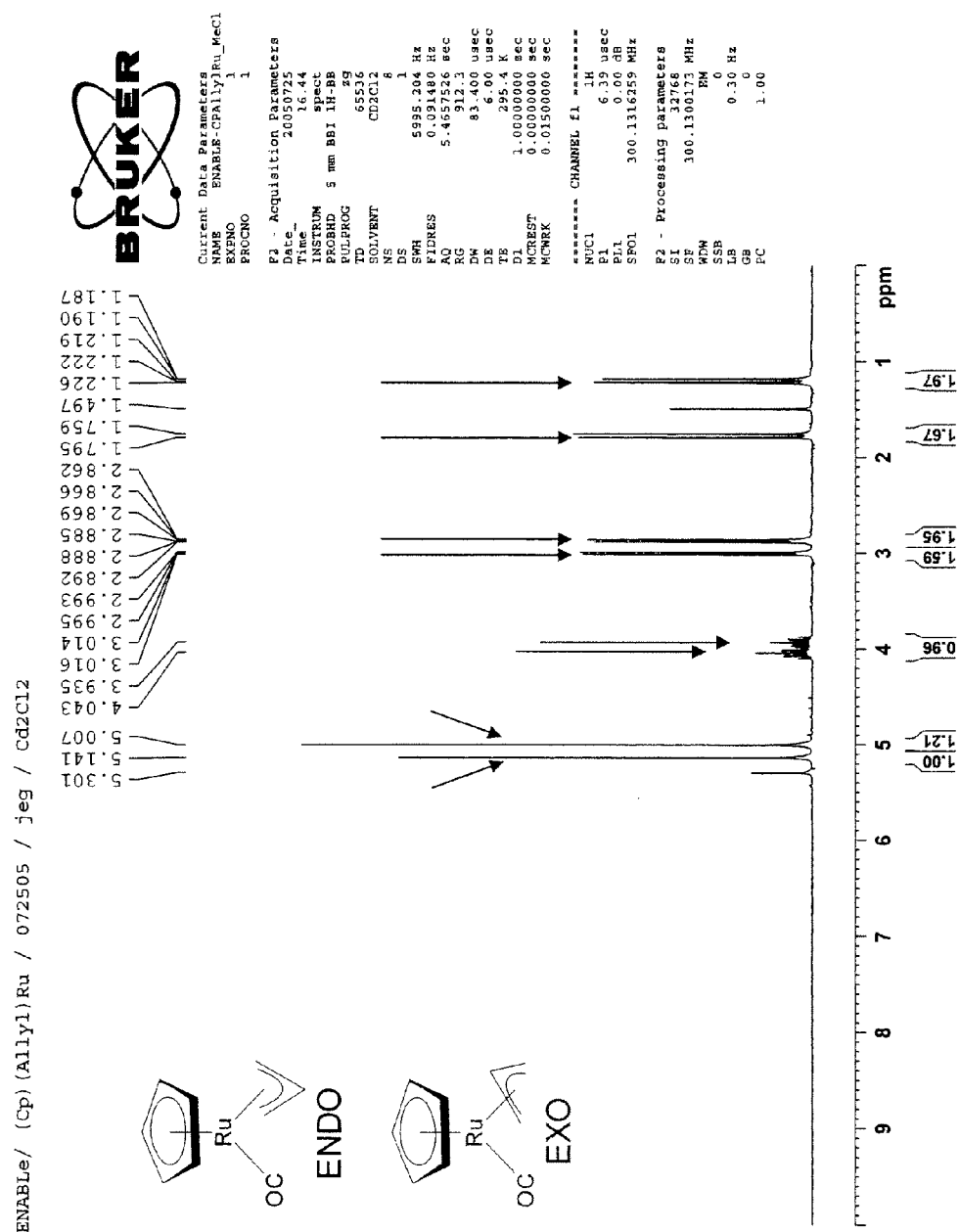
FIGS. 3A-3B are experimental results of an embodiment of forming a seed/barrier on a substrate.
Figure 3B:
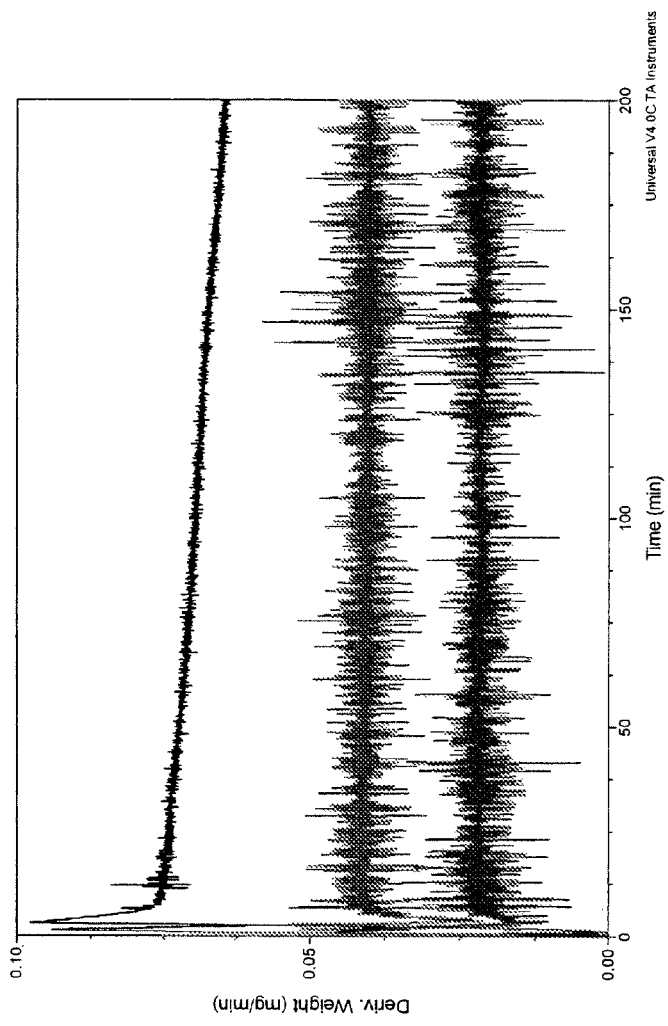
Figure 3B:
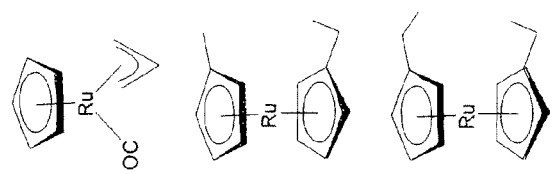

FIGS. 3A-3B are data for an embodiment of the invention. A conductive Ru film (40 ohm/sq) from the ruthenium-containing precursor $C_5H_5Ru(allyl)(CO)$ was deposited on a substrate using ALD. Temperature of the substrate was about 330° C. under H plasma with a power of about 15 W, 5 Torr using Ar as the carrier gas. The pulse sequence was 20 seconds precursor (cyclopentadienylRu(allyl)(CO) in Ar gas), 40 seconds purge (Ar gas), 20 seconds co-reactant ($H_2$/Ar plasma), 40 seconds purge (Ar gas). The sequence was repeated 50 times.

Figure 4:
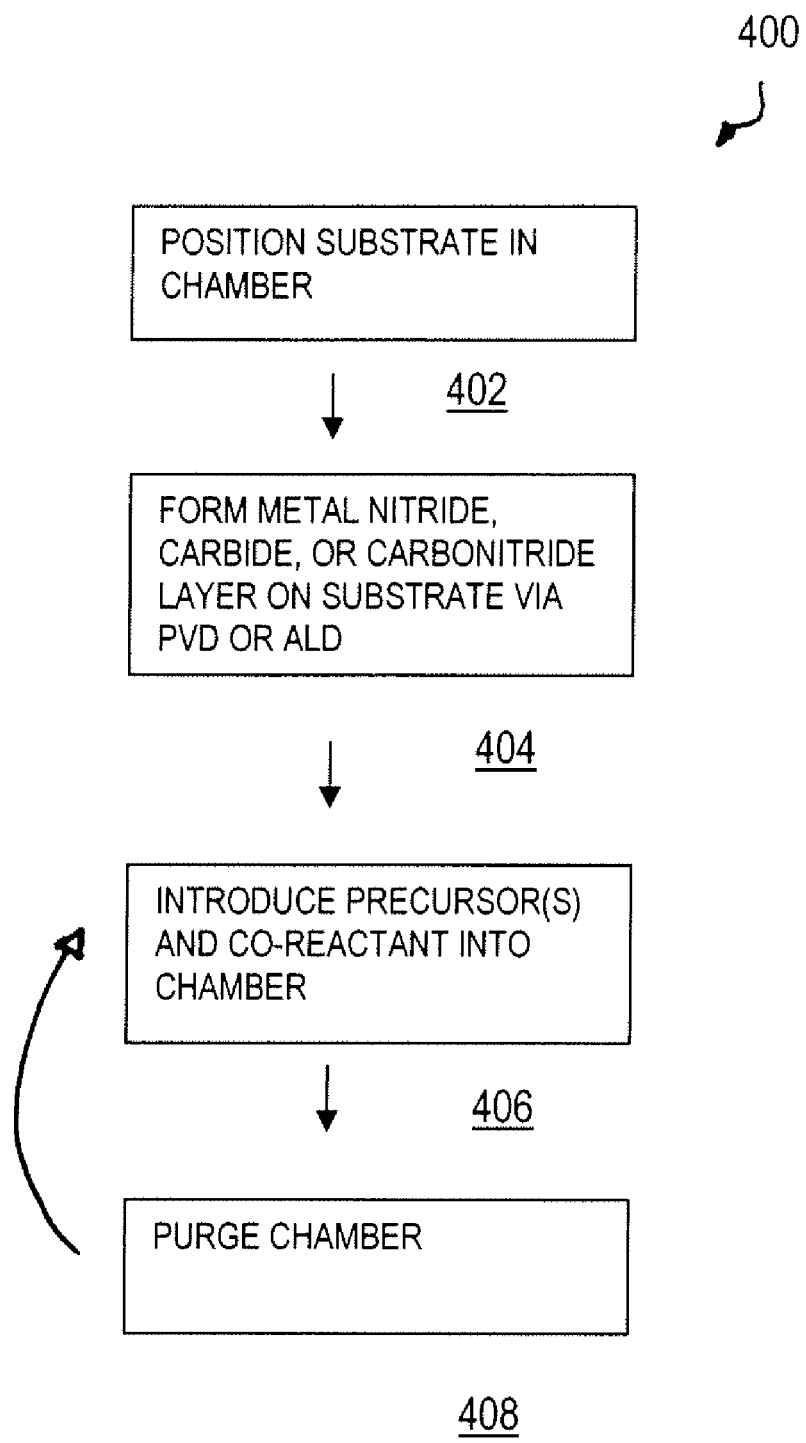
FIG. 4 is a flow chart representing an embodiment of a method of forming an adhesion layer using CVD.

FIG. 4 illustrates a schematic representation of a method of depositing a CVD layer on a substrate and a copper interconnect in accordance with an embodiment of the invention. A substrate, such as the substrate illustrated in FIG. 1A, can be positioned in the chamber of a CVD reactor (402). The substrate may be a silicon wafer having at least one dielectric layer deposited on its surface. The dielectric layer may include one or more trenches and/or vias within which the layer will be deposited and the copper interconnect will be formed. The dielectric layer may be formed from conventional materials used in dielectric layers, including, but not limited, to oxides such as $SiO_2$ and CDO, SiN, and organic polymers such as PFCB. The substrate may be heated within the reactor to a temperature between around 50° C. and around 400° C. The pressure within the reactor may range from 0.05 Torr to 3.0 Torr.

In some embodiments, a metal precursor containing carbon and/or nitrogen can be deposited on the substrate to form a metal nitride and/or carbide barrier layer (404). The resulting layers (or films) can include, but are not limited to, titanium nitride, tungsten nitride, tantalum nitride, in addition to tantalum carbide and tantalum carbonitride. In one embodiment, an organometallic nitride precursor is of the general formula $R_3TaNR'$ where R is an amide, an alkyl (such as neopentyl) or a hydride, and R' is any anionically charged hydrocarbon group, such as a 1- to 5-membered straight or branched alkyl group. In some embodiments, R' is a tert-butyl or tert-amyl group. The barrier layer can substantially or completely prevent diffusion of the subsequently-deposited interconnect material into the dielectric layer of the substrate. The barrier layer can be between about 1 nm and 20 nm.

Next, a process cycle is carried out in which at least one precursor, such as a ruthenium-containing precursor, a tantalum-containing precursor described previously, and at least one co-reactant are introduced into the reactor to react and form an adhesion layer on the barrier layer (406). In some embodiments, a homogenous pre-mixed combination of a ruthenium-containing precursor and a tantalum-containing precursor can be the precursor material and introduced into the reactor. In other embodiments, a ruthenium-containing precursor and a tantalum-containing precursor can be simultaneously introduced into the reactor along with the co-reactant. The precursor and the co-reactant can be introduced into the reactor in discrete pulses or in a continuous manner.

At least one co-reactant may include, but is not limited to, $H_2$, hydrogen plasma, $S_8$, trimethyl silyl azide, Xe, $NH_3$, $B_2H_6$, $CH_4$, $SiH_4$ or plasma combinations thereof. In still further embodiments, a different metal precursor such as those for aluminum, copper, ruthenium, and tantalum may be used as a co-reactant to alloy with the precursor metal during deposition to improve resistive properties or diffusion barrier properties of the adhesion layer.

In various embodiments of the invention, the following process parameters may be used for the introduction of the precursor into the CVD reactor. The precursor may flow into the reactor for a time period dependent upon the desired thickness of the final adhesion layer and the deposition rate of the process gas. During this time the precursor may have a flow rate of up to 10 SCCM. The precursor temperature may be between around 80° C. and 200° C. The vaporizer temperature may be around 60° C. to around 250° C.

In some embodiments, a heated carrier gas may be employed with a temperature that generally ranges from around 60° C. to around 200° C. Carrier gases that may be used include, but are not limited to, He, Xe, Ar, $N_2$, any combination thereof, or any other suitable non-reactive gas. The flow rate of the carrier gas may range from around 100 SCCM to around 200 SCCM.

In various embodiments of the invention, the following process parameters may be used for the introduction of the co-reactant into the CVD reactor. The co-reactant may flow into the reactor for a time period that ranges from 0.5 seconds to 10 seconds, depending on the desired thickness of the final adhesion layer. The time duration of the co-reactant flow need not be the same as the time duration of the precursor flow. During this time the co-reactant may have a flow rate of up to 10 SLM. The co-reactant temperature may be between around 80° C. and 250° C.

The precursor and co-reactant delivery lines into the reactor may be heated to a temperature that ranges from 60° C. to 250° C., or alternatively, to a temperature that is at least 10° C. hotter than the volatile precursor and co-reactant flow temperatures within the delivery lines to avoid condensation of the precursor and/or the co-reactant. Before discharge, the delivery line pressure may be set to around 0 to 5 psi, while the opening may be between 0.1 mm and 1.0 mm in diameter.

Finally, an RF energy source may be applied at a power that ranges from 5 Watts (W) to 1000 W and at a frequency of 13.56 MHz, 27 MHz, or 60 MHz. It should be noted that the scope of the invention includes any possible set of process parameters that may be used to carry out the embodiments of the invention described herein.

Simultaneous precursor/co-reactant introduction is repeated until the target film thickness is achieved. The final adhesion layer may be between about 1 nm and 5 nm. The reactor may then be purged (408). The purge gas may be an inert gas such as Ar, Xe, $N_2$, He, or other non-reactive gas and the duration of the purge may range from 0.1 seconds to 60 seconds, depending on the CVD reactor configurations and other deposition conditions. In some embodiments, the purge may range from 0.5 seconds to 5 seconds.

The above process results in the formation of ruthenium-containing, tantalum-containing layers, or combinations thereof. In some embodiments, the layer is deposited directly onto the dielectric layer. The film can be cleaned by immersion in a wet chemical solution, plasma or a plating bath to remove surface oxides and contaminants. A trench (such as the trench in FIGS. 1A-1E) can then be filled with copper by electroplating or electroless plating. In some embodiments, Ru ALD or CVD can be used to fill the trench.

In some embodiments, a barrier layer of tantalum nitride, tantalum carbide or tantalum carbonitride can be formed on a substrate by ALD followed by the formation of a ruthenium-containing adhesion layer by ALD or CVD from at least one of the precursors described previously. In some embodiments, a barrier layer of tantalum nitride, tantalum carbide or tantalum carbonitride can be formed on a substrate by ALD followed by the formation of a tantalum- or ruthenium-containing adhesion layer by PVD.

A PVD process can be performed by the following sequence: 1) the material to be deposited (e.g., Ta) is converted into vapor by physical means; 2) the vapor is transported across a region of low pressure from its source to the substrate; and 3) the vapor undergoes condensation on the substrate to form the thin film. A common method of accomplishing PVD of thin films is by sputtering. Sputtering relies on a plasma (usually a noble gas, such as Argon) to knock material from a "target" a few atoms at a time. The target can be kept at a relatively low temperature because the target does not have to be heated. Coverage by sputtering is more or less conformal.

Figure 5:
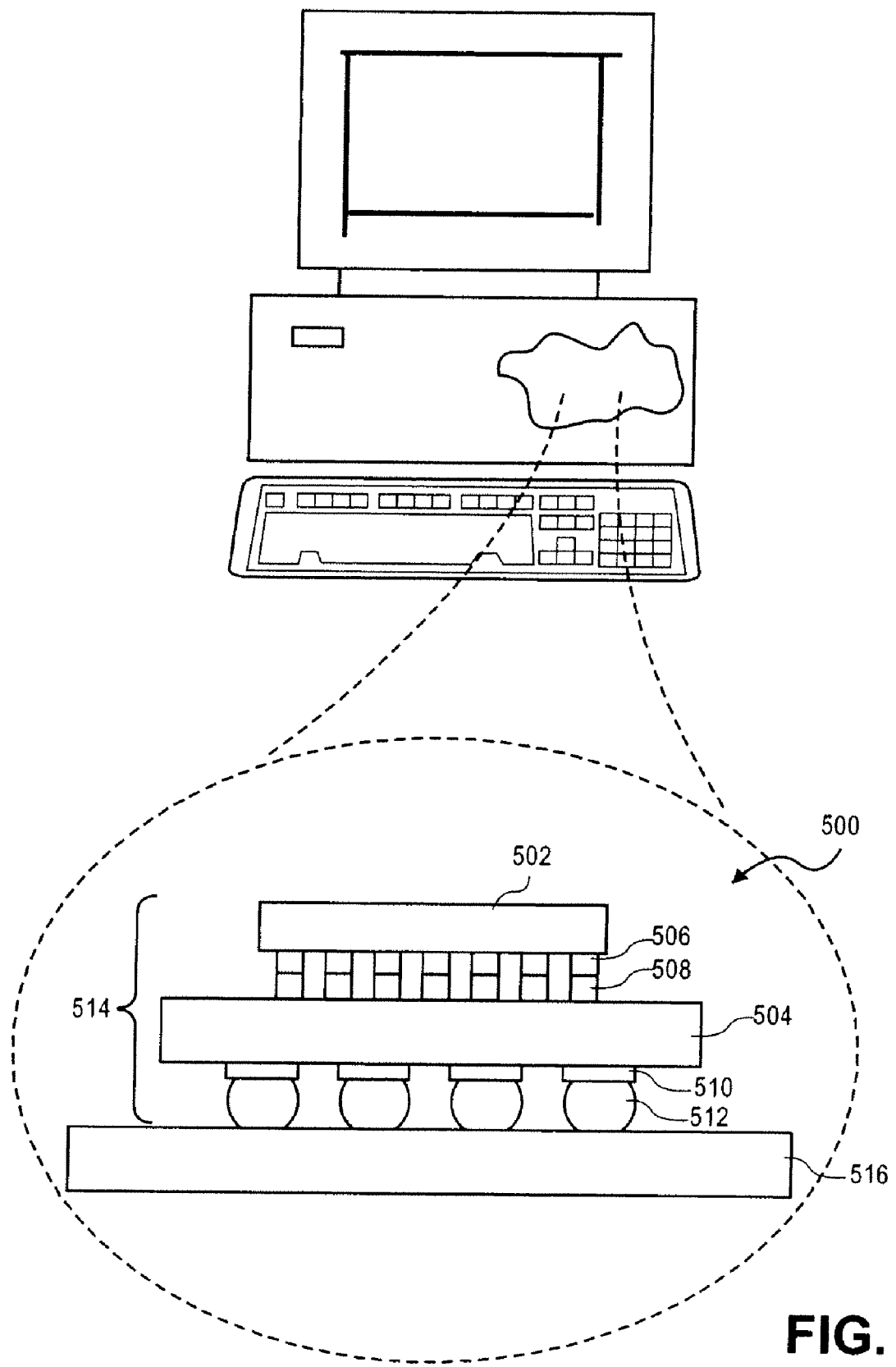
FIG. 5 shows a computer system including microprocessor enclosed by a package mounted to a printed circuit board.

FIG. 5 shows a cross-sectional side view of an integrated circuit package that is physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tapes and compact disc player, video cassette recorder, motion picture expert group audio layer 3 player (MP3), etc.), and the like. FIG. 5 illustrates the electronic assembly as part of a desktop computer. FIG. 5 shows electronic assembly 500 including die 502, physically and electrically connected to package substrate 504. Die 502 is an integrated circuit die, such as a microprocessor die, having, for example, transistor structures interconnected or connected to power/ground or input/output signals external to the die through interconnect lines to contacts 506 on an external surface of die 502. The die may be formed in accordance with known wafer processing techniques. Contacts 506 of die 502 may be aligned with contacts 508 making up, for example, a die bump layer on an external surface of package substrate 504. On a surface of package substrate 504 opposite a surface including contacts 508 are land contacts 510. Connected to each of land contacts 510 are solder bumps 512 that may be used to connect package 514 to circuit board 516, such as a motherboard or other circuit board.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:
   forming a first layer comprising a material selected from the group consisting of a metal nitride, a metal carbide and a metal carbonitride on a substrate wherein the substrate includes at least one trench etched into a dielectric layer of the substrate;
   forming a second layer on the first layer, the second layer comprising a material selected from the group consisting of ruthenium, tantalum and a combination thereof wherein (i) if a ruthenium layer is formed, forming comprises introducing a ruthenium-containing precursor selected from the group consisting of RuRR'R", (Ring)RuL$_2$R, (Ring)RuLL'R and (Ring)Ru[($\eta^3$-R)(Ring)RuL$_2$] where R is a negatively charged two-electron donor; L is a neutral two-electron donor; $\eta^3$-R is a negatively charged chelating four-electron donor; and Ring is an unfunctionalized or functionalized member of a group comprising cyclic dienes, pyrroles, dienes, boratabenzene and dienes containing heteroatoms; or (ii) if a tantalum layer is formed, forming comprises introducing a tantalum-containing precursor selected from the group consisting of allylTa(CH$_3$)$_3$ where allyl is $\eta^3$C$_5$H$_5$; (C$_5$H$_5$)$_2$TaR variations where R is amide or alkyl substituents; Ta(borilidiene)-containing precursors; (PR$_3$=N)Ta variations where R is a hydrogen, an alkyl or a phenyl substituent and PR$_3$=N is a phosphinamide ligand; and selenium analogs thereof where R is a ring structure selected from the group consisting of cyclic dienes, mesityl, phenyl, tolyl, pyrroles and pyridyl; and
   depositing a third layer comprising copper on the second layer and within the at least one trench.

2. The method of claim 1, further comprising, before depositing the third layer, cleaning the substrate by subjecting the substrate to a method selected from the group consisting of a wet chemical solution, a plasma and a plating bath.

3. The method of claim 1, wherein R is selected from the group consisting of an imide, a nitrile and an alkyldiene; L is selected from the group consisting of carbon monoxide, nitric oxide, dienes, amine, nitrile, isocyanides and phosphanes; and $\eta^3$-R is selected from the group consisting of allyls, azaallyls, amidinates and cyclobutadienes.

4. The method of claim 1, wherein the metal nitride, metal carbide or metal carbonitride layer is selected from the group consisting of tantalum nitride, tantalum carbide and tantalum carbonitride.

5. The method of claim 4, wherein the metal nitride, metal carbide or metal carbonitride layer is tantalum nitride formed from a composition having a general formula of R$_3$TaNR' where R is an alkyl, hydrogen or an amide.

6. The method of claim 1, wherein the first layer is formed by an atomic layer deposition process.

7. The method of claim 1, wherein the second layer is formed by a method selected from the group consisting of an atomic layer deposition process, a chemical vapor deposition process and a physical vapor deposition process.

8. A method comprising:
   introducing a semiconductor substrate in a reactor, wherein the semiconductor substrate includes at least one trench etched into a dielectric layer of the substrate;
   forming a barrier layer on the substrate;
   forming an adhesion layer on the barrier layer by introducing an organometallic precursor and a co-reactant into the reactor proximate to the semiconductor substrate to form the adhesion layer, wherein the precursor comprises a material selected from the group consisting of a ruthenium-containing material and a tantalum-containing material, (i) the ruthenium-containing material selected from the group consisting of RuRR'R", (Ring)RuL$_2$R, (Ring)RuLL'R and (Ring)Ru[($\eta^3$-R)(Ring)RuL$_2$] where R is a negatively charged two-electron donor; L is a neutral two-electron donor; $\eta^3$-R is a negatively charged chelating four-electron donor; and Ring is an unfunctionalized or functionalized member of a group comprising cyclic dienes, pyrroles, dienes, boratabenzene and dienes containing heteroatoms; and (ii) the tantalum-containing material selected from the group consisting of allylTa(CH$_3$)$_3$ where allyl is $\eta^3$C$_5$H$_5$; (C$_5$H$_5$)$_2$TaR variations where R is amide or alkyl substituents; Ta(borilidiene)-containing precursors; (PR$_3$=N)Ta variations where R is a hydrogen, an alkyl or a phenyl substituent and PR$_3$=N is a phosphinamide ligand; and selenium analogs thereof where R is a ring structure selected from the group consisting of cyclic dienes, mesityl, phenyl, tolyl, pyrroles and pyridyl; and
   depositing a copper layer on the adhesion layer and in the at least one trench.

9. The method of claim 8, further comprising, before depositing the copper layer, cleaning the substrate by subjecting the substrate to one of a wet chemical solution, a plasma or a plating bath.

10. The method of claim 8, wherein the depositing of the copper layer comprises:
    transferring the semiconductor substrate to a copper plating bath; and
    depositing the copper layer on the adhesion layer using a plating process.

11. The method of claim 10, wherein the plating bath comprises an electroplating bath and the plating process comprises an electroplating process.

12. The method of claim 10, wherein the plating bath comprises an electroless plating bath and the plating process comprises an electroless plating process.

13. The method of claim 8, wherein the co-reactant comprises a material selected from the group consisting of atomic hydrogen, hydrogen gas, hydrogen plasma, sulfur, trimethylsilylazide, xenon, ammonia gas, diborane, methane, silane and plasma combinations thereof.

14. The method of claim 8, wherein the barrier layer is formed from a material selected from the group consisting of tantalum nitride, tantalum carbide and tantalum carbonitride.

15. The method of claim 14, wherein the barrier layer is tantalum nitride formed from a composition having a general formula of $R_3TaNR'$ where R is an alkyl, hydrogen or an amide and R' is an anionically charged hydrocarbon group.

16. The method of claim 8, wherein the barrier layer is formed by atomic layer deposition and the adhesion layer is formed by a method selected from the group consisting of atomic layer deposition, chemical vapor deposition and physical vapor deposition.

17. The method of claim 8, wherein R is selected from the group consisting of an amide, a nitride and an alkyldiene; L is selected from the group consisting of carbon monoxide, nitric oxide, dienes, amine, nitrile, isocyanides and phosphanes; and $\eta^3$-R is selected from the group consisting of allyls, azaallyls, amidinates and cyclobutadienes.

18. The method of claim 8, wherein the adhesion layer is a homogenous mixture of a ruthenium-containing precursor and a tantalum-containing precursor.

19. A method comprising:
introducing a semiconductor substrate in a reactor, wherein the semiconductor substrate includes at least one trench etched into a dielectric layer of the substrate;
forming a barrier layer on the substrate;
pulsing an organometallic precursor into the reactor proximate to the semiconductor substrate, wherein the precursor comprises a material selected from the group consisting of a ruthenium-containing material and a tantalum-containing material, (i) the ruthenium-containing material selected from the group consisting of RuRR'R", (Ring)RuL$_2$R, (Ring)RuLL'R and (Ring)Ru[($\eta^3$-R)(Ring)RuL$_2$] where R is a negatively charged two-electron donor; L is a neutral two-electron donor; and $\eta^3$-R is a negatively charged chelating four-electron donor; and Ring is an unfunctionalized or functionalized member of a group comprising cyclic dienes, pyrroles, dienes, boratabenzene and dienes containing heteroatoms; and (ii) the tantalum-containing material selected from the group consisting of allylTa(CH$_3$)$_3$ where allyl is $\eta^3$C$_3$H$_5$; (C$_5$H$_5$)$_2$TaR variations where R is amide or alkyl substituents; Ta(borilidiene)-containing precursors; (PR$_3$=N)Ta variations where R is a hydrogen, an alkyl or a phenyl substituent and PR$_3$=N is a phosphinamide ligand; and selenium analogs thereof where R is a ring structure selected from the group consisting of cyclic dienes, mesityl, phenyl, tolyl, pyrroles and pyridyl;
purging the reactor after the precursor pulse;
pulsing a co-reactant into the reactor proximate to the substrate, wherein the co-reactant reacts with the precursor to form a ruthenium- or tantalum-containing adhesion layer on the barrier layer;
purging the reactor after the co-reactant pulse; and
depositing a copper layer on the adhesion layer and in the at least one trench.

20. The method of claim 19, further comprising, before depositing the copper layer, cleaning the substrate by subjecting the substrate to one of a wet chemical solution, a plasma or a plating bath.

21. The method of claim 19, wherein the depositing of the copper layer comprises:
transferring the semiconductor substrate to a copper plating bath; and
depositing the copper layer on the adhesion layer using a plating process.

22. The method of claim 21, wherein the plating bath comprises an electroplating bath and the plating process comprises an electroplating process.

23. The method of claim 21, wherein the plating bath comprises an electroless plating bath and the plating process comprises an electroless plating process.

24. The method of claim 19, wherein the co-reactant comprises a material selected from the group consisting of atomic hydrogen, hydrogen gas, hydrogen plasma, sulfur, trimethylsilylazide, xenon gas, ammonia gas, diborane, methane, silane and plasma combinations thereof 25. The method of claim 19, wherein the barrier layer is selected from the group consisting of tantalum nitride, tantalum carbide and tantalum carbonitride.

26. The method of claim 25, wherein the barrier layer is tantalum nitride formed from a composition having a general formula of $R_3TaNR'$ where R is an alkyl, hydrogen or an amide and R' is an anionically charged hydrocarbon group.

27. The method of claim 19, wherein the barrier layer is formed by atomic layer deposition and the adhesion layer is formed by a method selected from the group consisting of atomic layer deposition, chemical vapor deposition and physical vapor deposition.

28. The method of claim 19, wherein R is selected from the group consisting of an amide, a nitride and an alkyldiene; L is selected from the group consisting of carbon monoxide, nitric oxide, dienes, amine, nitrile, isocyanides and phosphanes; and $\eta^3$-R is selected from the group consisting of allyls, azaallyls, amidinates and cyclobutadienes.

29. The method of claim 19, wherein the adhesion layer is a combination of a ruthenium-containing precursor and a tantalum-containing precursor.

30. The method of claim 29, wherein the adhesion layer is deposited by a process selected from the group consisting of (i) pulsing of a pre-mixed combination of a ruthenium-containing precursor and a tantalum-containing precursor, (ii) simultaneous pulsing of a ruthenium-containing precursor and a tantalum-containing precursor, and (iii) sequential pulsing of a ruthenium-containing precursor and a tantalum-containing precursor.

* * * * *